United States Patent [19]

Murai

[11] Patent Number: 5,252,856

[45] Date of Patent: Oct. 12, 1993

[54] OPTICAL SEMICONDUCTOR DEVICE

[75] Inventor: Nobuhiro Murai, Tokyo, Japan

[73] Assignee: NEC Corporation, Tokyo, Japan

[21] Appl. No.: 17,311

[22] Filed: Feb. 10, 1993

Related U.S. Application Data

[63] Continuation of Ser. No. 762,589, Sep. 19, 1991, abandoned.

[30] Foreign Application Priority Data

Sep. 26, 1990 [JP] Japan ................................ 2-255601

[51] Int. Cl.⁵ ...................... H01L 23/02; H01L 23/12
[52] U.S. Cl. .................................... 257/678; 257/698;
257/704; 257/794; 257/734
[58] Field of Search ...................... 357/17, 74, 72, 73;
257/678, 698, 704, 794, 734

[56] References Cited

U.S. PATENT DOCUMENTS

| | | | |
|---|---|---|---|
| 2,796,563 | 6/1957 | Ebers et al. | 357/74 |
| 2,934,588 | 4/1960 | Ronci | 357/74 |
| 3,021,461 | 2/1962 | Oakes et al. | 357/74 |
| 3,030,560 | 4/1962 | Shearman | 357/74 |
| 3,311,798 | 3/1967 | Gray | 357/74 |
| 3,419,763 | 12/1968 | Beaudouin | 357/74 |
| 3,651,564 | 3/1972 | Glass | 357/74 |
| 3,805,347 | 4/1974 | Collins et al. | 357/73 |
| 4,233,619 | 11/1980 | Webb et al. | 357/74 |
| 4,240,098 | 12/1980 | Zory et al. | 357/81 |
| 4,394,679 | 7/1983 | Hawrylo | 357/81 |
| 4,571,612 | 2/1986 | Frister | 357/74 |
| 4,661,835 | 4/1987 | Gademann et al. | 357/68 |

FOREIGN PATENT DOCUMENTS 61-131550  6/1986  Japan.

Primary Examiner—Eugene R. LaRoche
Assistant Examiner—Viet Q. Nguyen
Attorney, Agent, or Firm—Laff, Whitesel, Conte & Saret

[57] ABSTRACT

According to this invention, an optical semiconductor device includes a flat metal plate, a glass member, a plurality of lead wires, an optical semiconductor element, and a cap member. The flat metal plate has a through hole in a direction of a thickness of the flat metal plate. The glass member is buried in the through hole of the flat metal plate. The plurality of lead wires are hermetically insulated and fixed in the flat metal plate through the glass member in the through hole. The optical semiconductor element is electrically connected to the lead wires. The cap member is fixed to the flat metal plate for housing the optical semiconductor element therein.

4 Claims, 3 Drawing Sheets

OPTICAL SEMICONDUCTOR DEVICE

This application is a continuation of application Ser. No. 07/762,589, filed Sep. 19, 1991, abandoned.

BACKGROUND OF THE INVENTION

The present invention relates to an optical semiconductor device and, more particularly, to a hermetically sealed optical semiconductor device.

At present, as an amount of information is increased, a large transmission capacity is strongly demanded. In a digital communication field, a communication speed is increasing from 0.6-Gbs modulation to 2.5-Gbs modulation.

Conventionally, as a package coped with the high-speed communication, a thin shell structure had been popular. This structure can reduce a capacitance between terminals and cope with the high-speed communication. However, the structure has the following decisive drawback. That is the welding thickness is too small to apply stem welding fixation using a laser, and the reliability of fixation cannot be improved.

As a package for solving the above drawback, a stem having a thick plate structure capable of applying laser welding fixation can be used. FIG. 3 is a longitudinal sectional view showing an optical semiconductor device having a thick plate structure. As shown in FIG. 3, the stem has the following structure. That is, lead wires 1a and 1b are hermetically insulated and fixed in a flat metal plate 3 through glass members 2. Each of the glass members 2 is in contact with the flat metal plate 3 on only a side A substantially parallel to the lead wires 1a and 1b, and only one lead wire is fixed in one of the glass members 2 surrounded by one contact side between one of the glass members 2 and the flat metal plate 3.

The glass members 2 are generally made of oxide glass, and the lead wires and the flat metal plate are generally made of iron or a nickel alloy.

In the above conventional semiconductor device, since one lead wire is fixed in a glass member surrounded by one contact side between the glass member and the flat metal plate, the flat metal plate is interposed between the two lead wires hermetically insulated and fixed in the flat metal plate through the glass members. Therefore, when the distance between the lead wires is predetermined, the thicknesses of the glass members located between the lead wires are limited. As a result, a capacitance between the lead wires cannot be reduced, and high-speed modulation cannot be easily performed.

SUMMARY OF THE INVENTION

It is an object of the present invention to provide an optical semiconductor device capable of decreasing a capacitance between lead wires.

It is another object of the present invention to provide an optical semiconductor device capable of performing high-speed modulation in optical communication.

In order to achieve the above objects of the present invention, there is provided an optical semiconductor device comprising a flat metal plate having a through hole in a direction of a thickness of the flat metal plate, a glass member buried in the through hole of the flat metal plate, a plurality of lead wires hermetically insulated and fixed in the flat metal plate through the glass member in the through hole an optical semiconductor element electrically connected to the lead wires, and a cap member fixed to the flat metal plate for housing the optical semiconductor element therein.

DESCRIPTION OF THE PREFERRED EMBODIMENTS

The present invention will be described below with reference to the accompanying drawings.

Figure 1A:
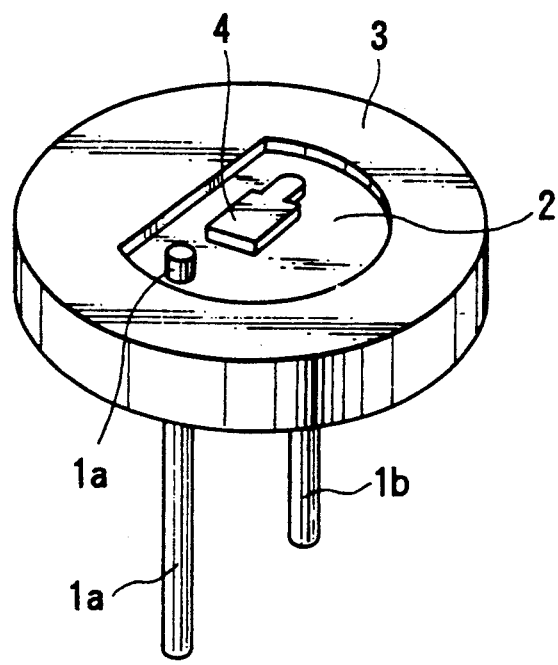
FIG. 1A is a perspective view of the first embodiment of the present invention.
Figure 1B:
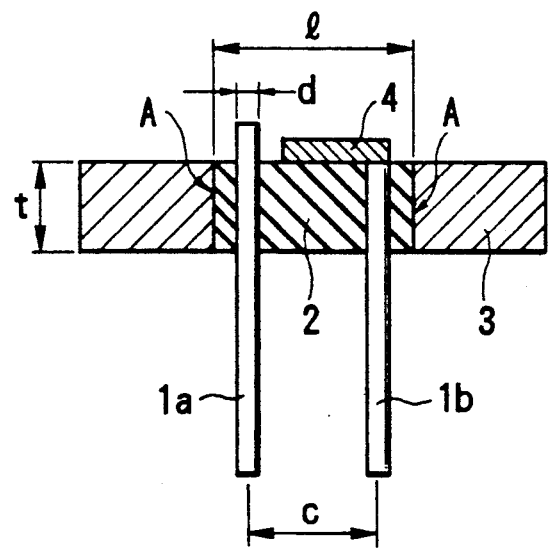
FIG. 1B is a longitudinal sectional view of the first embodiment of the present invention.

FIGS. 1A and 1B show an embodiment of the present invention.

As shown in FIGS. 1A and 1B, two lead wires 1a and 1b are bonded to a glass member 2 buried in a through hole 3a of a flat metal plate 3, the glass member 2 is bonded to the inner wall of the through hole 3 on a side A which is substantially parallel to the lead wires 1a and 1b. A metal piece 4 is conductively adhered to the lead wire 1b by electric resistance welding or brazing. The lead wires 1a and 1b are hermetically bonded to the glass member 2, and the glass member 2 is hermetically bonded to the flat metal plate 3. In addition, the glass member 2 electrically insulates the lead wire 1a from the lead wire 1b, and the glass member 2 electrically insulates the lead wires 1a and 1b from the flat metal plate 3.

A light emitting/receiving element is mounted on the metal piece 4. After the light-emitting or light-receiving element is connected to thin metal wires, it is controlled by an external circuit through the lead wires 1a and 1b.

A cap (not shown) is welded on the upper surface of the flat metal plate 3 by electric resistance welding and hermetically seals an optical semiconductor device constituted by the light-emitting or light-receiving element.

A hermetically sealed semiconductor device according to the present invention includes two lead wires in the same sealing glass although it has a thick plate structure. Therefore, the stem has a high reliability in fixation and can be applied to high-speed modulation.

The unit cost of the stem is the same as that of conventional one, and cost performance can be largely improved.

Figure 2A:
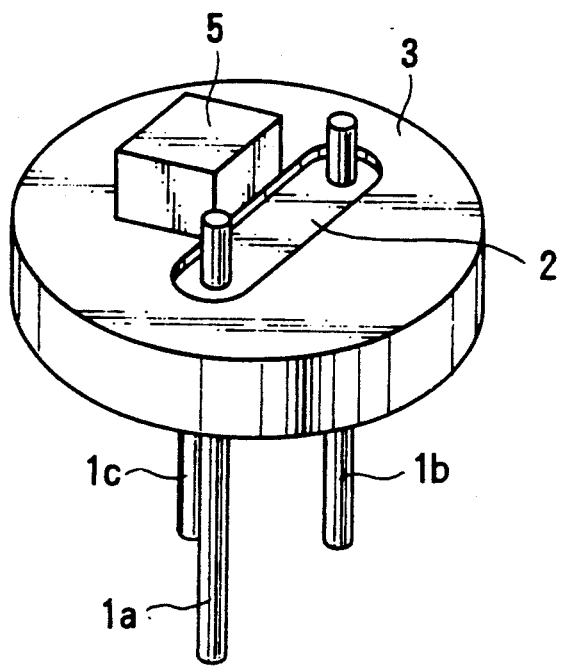
FIG. 2A is a perspective view of the second embodiment of the present invention.
Figure 2B:
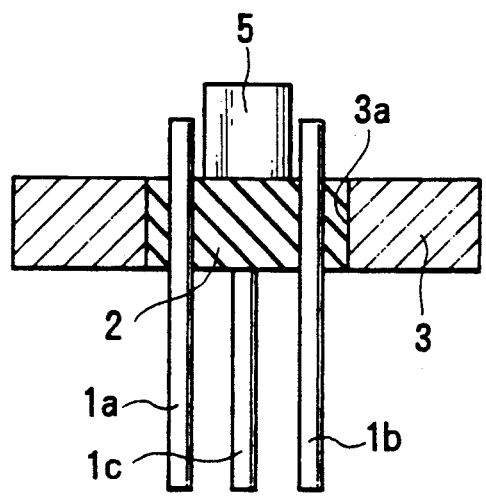
FIG. 2B is a longitudinal sectional view of the second embodiment of the present invention.

FIGS. 2A and 2B show the second embodiment of the present invention.

In the second embodiment, in place of a metal piece 4, a metal block is conductively adhered to a flat metal plate 3 by brazing or the like. In addition, a laser element is mounted on the side of the metal block 5, connected to lead wires 1a and 1b by thin metal wires, and then driven and controlled by an external circuit.

The second embodiment shows that the present invention can be applied not only to a light-emitting or light-receiving element but to a laser element.

Figure 4A:
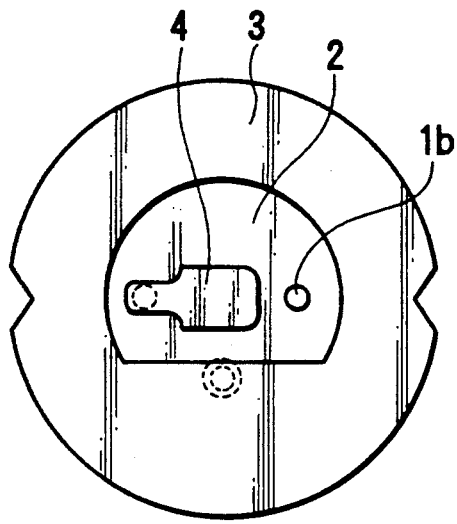
FIG. 4A is a plan view of the third embodiment of the present invention.
Figure 4C:
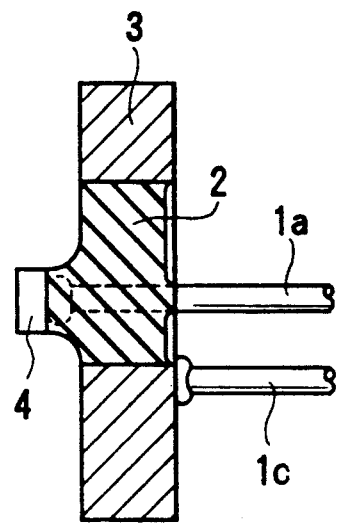
FIG. 4C is a cross-sectional view of the third embodiment of the present invention.
Figure 4B:
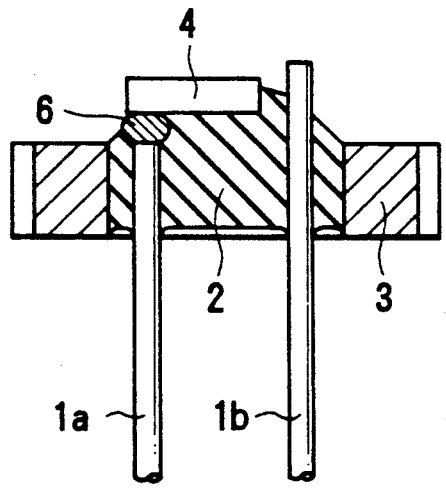
FIG. 4B is a longitudinal sectional view of the third embodiment of the present invention.

FIGS. 4A to 4C show the third embodiment of the present invention. The third embodiment has the same arrangement as that of the first embodiment, and a description thereof will be omitted. Compared with the first embodiment, the upper portion of a glass member 2 having the exposed upper ends of lead wires 1a and 1b is formed into a projecting shape so as to increase the thickness of the glass plate, thereby strongly fixing the lead wires 1a and 1b to the glass member. Note that reference numeral 6 denotes an adhered portion between the lead wire 1a and a metal piece 4.

Figure 5:
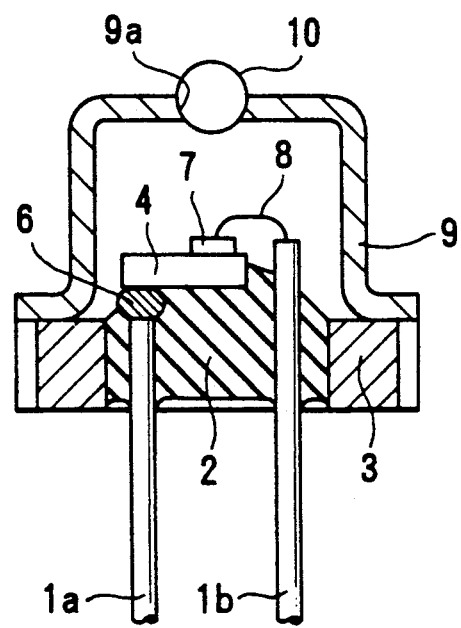
FIG. 5 is a cross-sectional view showing an optical semiconductor device of FIG. 4B as a whole.

FIG. 5 is a cross-sectional view showing the optical semiconductor device of FIG. 4B as a whole. A light-receiving element 7 mounted on the metal piece 4 is connected to the lead wire 1b through a bonding wire 8, and a cylindrical cap member 9 is fixed to the metal plate 3 to cover these elements. A lens 10 for converging beams to the light-receiving element 7 is fitted in an opening 9a formed in the top portion of the cap member 9.

As described above, since a stem according to the present invention has a structure in which two or more lead wires are fixed in a glass member surrounded by one contact side between the glass member and a flat metal plate, a capacitance between the two lead wires hermetically insulated and fixed to the flat metal plate through the glass member can be advantageously decreased.

Figure 3:
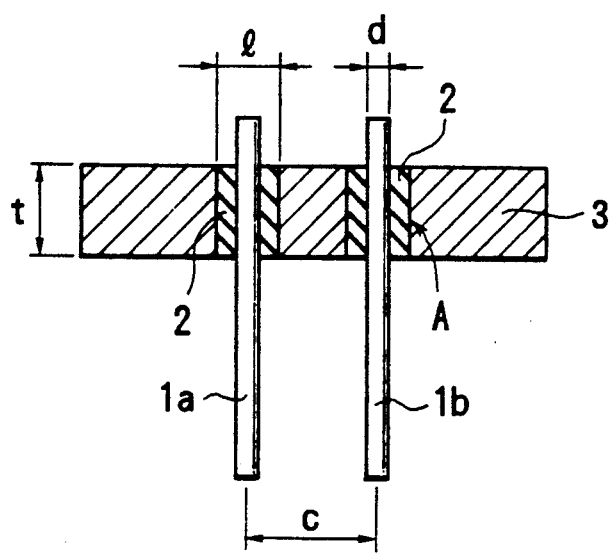
FIG. 3 is a longitudinal sectional view showing a conventional optical semiconductor device.

An actual capacitance obtained by the embodiment shown in FIGS. 1A and 1B and a cutoff frequency of a frequency response obtained by mounting a light-receiving element on the metal piece 3 are shown in Table 1. Reference symbol l denotes the diameter of the glass portion as shown in FIGS. 1B and 3; d, the diameter of each lead wire; c, the distance between the lead wires; and t, the thickness of the flat metal plate.

As shown in Table 1, according to the present invention, the following effects can be obtained. That is, the capacitance can be reduced to 60% of a conventional one, the cutoff frequency can be increased from 1.2 GHz to 3.5 GHz.

TABLE 1

| | l | d | c | t | Capacitance | unit: mm Cutoff Frequency |
|---|---|---|---|---|---|---|
| Present Invention | 3.0 | 0.38 | 2.0 | 1.2 | 0.02 (pF) | 3.5 (GHz) |
| Prior Art | 1.0 | 0.38 | 2.0 | 1.2 | 0.35 (pF) | 1.2 (GHz) |

As apparent from the above description, the present invention is much effective for reducing a capacitance between the lead wires of an optical semiconductor device, and the present invention contributes to future high-speed optical communications.

A chip-carrier package is conventionally used as a high-speed communication response package. A stem package according to the present invention has the following industrial advantages. That is, highly reliable and high-speed communication can be performed, and a higher-speed version of a communication system can be obtained without a change in design of an existing communication system.

I claim:

1. An optical semiconductor device comprising:
   a flat metal plate base member having a single through hole extending in a direction of a thickness of said flat metal plate;
   a glass member buried in and sealed to wall of the through hole;
   a plurality of lead wires hermetically insulated from each other by being fixed to and passing through said glass member in said single through hole whereby no part of said metal plate base member is located between said lead wires;
   an optical semiconductor element electrically connected to said lead wires; and
   a cap member fixed to said flat metal base plate for housing said optical semiconductor element therein.

2. An optical semiconductor device according to claim 1, wherein said through hole has a metal plate wall and said glass member is in contact with only said wall.

3. An optical semiconductor device according to claim 1, further comprising a metal piece, for connecting said optical semiconductor element, mounted to be connected to one of said lead wires on an upper surface of said glass member.

4. An optical semiconductor device comprising:
   a flat metal plate having a through hole extending in a direction of a thickness of said flat metal plate;
   a glass member buried in and sealed to the through hole;
   a plurality of lead wires hermetically insulated and fixed to and passing through said glass member;
   an optical semiconductor element electrically connected to said lead wires;
   a metal block conductively adhered to an upper surface of said flat metal plate and having a side surface, said optional element being a laser element mounted on said side surface of said metal block; and
   a cap member fixed to said flat metal plate housing said optical semiconductor element therein.

* * * * *